(12) United States Patent
Huang et al.

(10) Patent No.: US 8,106,688 B2
(45) Date of Patent: Jan. 31, 2012

(54) POWER-ON-RESET CIRCUIT WITH BROWN-OUT RESET FOR MULTIPLE POWER SUPPLIES

(75) Inventors: Haitao Huang, Guangdong (CN); Min Zhang, Guangdong (CN); Liding Yin, Guangdong (CN)

(73) Assignee: Smartech Worldwide Limited, Hong Kong (CN)

( * ) Notice: Subject to any disclaimer, the term of this patent is extended or adjusted under 35 U.S.C. 154(b) by 314 days.

(21) Appl. No.: 12/620,689

(22) Filed: Nov. 18, 2009

(65) Prior Publication Data

US 2011/0115533 A1 May 19, 2011

(51) Int. Cl.
*H03K 7/00* (2006.01)

(52) U.S. Cl. ............... 327/143; 327/80; 327/81

(58) Field of Classification Search ............ 327/77, 327/78, 80, 81, 142, 143, 198
See application file for complete search history.

(56) References Cited

U.S. PATENT DOCUMENTS

| | | | |
|---|---|---|---|
| 4,717,840 A | 1/1988 | Ouyang | |
| 5,534,804 A * | 7/1996 | Woo | 327/143 |
| 6,137,324 A | 10/2000 | Chung | |
| 6,144,237 A | 11/2000 | Ikezaki | |
| 6,744,291 B2 * | 6/2004 | Payne et al. | 327/143 |
| 6,847,240 B1 | 1/2005 | Zhou | |
| 6,879,194 B1 | 4/2005 | Caldwell | |
| 6,882,193 B2 * | 4/2005 | Hirano et al. | 327/143 |
| 6,972,602 B2 | 12/2005 | Akamatsu | |
| 7,126,391 B1 | 10/2006 | Smith | |
| 7,135,898 B2 | 11/2006 | Tseng | |
| 7,142,024 B2 | 11/2006 | Youssef | |
| 7,161,396 B1 | 1/2007 | Zhou | |
| 7,417,476 B1 * | 8/2008 | Hung | 327/143 |
| 7,432,748 B2 | 10/2008 | Khan | |
| 2004/0217785 A1 | 11/2004 | Colbeck | |

* cited by examiner

*Primary Examiner* — Long Nguyen
(74) *Attorney, Agent, or Firm* — SV Patent Service

(57) ABSTRACT

A power-on reset circuit includes a first circuit and a second circuit. The first circuit include a first NMOS transistor having a gate controlled by a low voltage supply VDD_L, a resistor connected between the source of the first NMOS transistor and a voltage supply VSS that is lower than VDD_L, and one or more diodes serially connected between a high voltage supply VDD_H and the drain of the first NMOS transistor. The second circuit includes a first PMOS transistor having a source connected to VDD_L, a second PMOS transistor having a source connected to the drain of first PMOS transistor, a second NMOS transistor connected between the drain of the second PMOS transistor and VSS, and an inverter configured to output a signal in response to the power on of the high voltage supply VDD_H and the low voltage supply VDD_L.

20 Claims, 5 Drawing Sheets

POWER-ON-RESET CIRCUIT WITH BROWN-OUT RESET FOR MULTIPLE POWER SUPPLIES

BACKGROUND OF THE INVENTION

The present disclosure relates to electronic devices, more particularly, to a power-on reset circuit for integrated circuits used in electronic devices.

When the electric device is powered up, a supply voltage VDD of an electronic device rises from zero voltage to a pre-defined voltage (e.g. 3.3V). During this period, logic states of internal latches or flip-flops in the electronic device are un-known because they may carry logic memories from previous logic states. Un-known internal logic states can cause unpredictable behaviors in the electronic device and prevent the electronic device from performing its intended functions. A power-on-reset (POR) circuit can provide reset signals to reset internal latches or flip-flops to well-defined logic states during a power-on period, thus ensuring the proper functions of the electronic device.

A conventional POR circuit 100, as shown in FIG. 1, includes a Schmitt trigger circuit 110 consisting of transistors P12/P13/N12/N13, a stabilization capacitor CO, a current source PMOS transistor P11, a resistor divider consisting of resistors R1 and R2, and an NMOS transistor N1. An output signal can be produced at a node PORB for resetting internal logics in an electronic device. The PMOS transistor P11 can provide source current from VDD to the resistor divider. The NMOS transistor N1 can produce a trigger signal at the node S2 for the Schmitt trigger circuit 110. The Schmitt trigger circuit 110 can bypass voltage fluctuations and clamp the voltage of the output node PORB during powers up. The PORB node is initially at ground voltage (which can be defined as zero voltage).

During power on, VDD rises from ground voltage to a pre-defined voltage, say 3.3V. The gate node of PMOS transistor P11 and the gate node of PMOS transistor P12 are both at zero voltage, thus both turn on. The current flows through P11 can produce a voltage at the node S1 as defined by VIN×R2/(R1+R2) where VIN is the drain voltage of P11. The current flows through P12 can cause the voltage at S2 to follow the rise of the voltage supply VDD. The node S2 has a higher voltage than the node S1 as S1 is resistive divided by VDD.

NMOS transistor N13 can therefore turn on once the voltage at the node S2 reaches its threshold turn-on voltage. When N13 turns on, the node PORB is further clamped to zero voltage. When VDD rises up further to reach the threshold turn-on voltage of NMOS transistor N1, N1 is turned on and pulls the node S2 low. At that moment, P12 is already turned on and therefore P12/N1 forms a resistive divider at the node S2. If N1 is made much larger than P12, then the pulling effect to the node S2 is much stronger at N1, the node S2 can be easily pulled to zero voltage, which can shut off the N13 and turns on P13. As a result, the PORB node changes from logic low to logic high. Subsequently P12 is shut off and N12 is turned on by the high logic level at the node PORB. P11 is also shut off, thus preventing direct DC current from flowing through the resistive divider and minimizing power consumption.

Recently, more and more integrated circuits are powered by multiple power supplies that may have the same or different voltages. The logic portion of the integrated circuit may be supplied at 1.8 volt. The 10 portion of the integrated circuit may be powered at 3.3 volt. The analog portion of the integrated circuit may be supplied by yet another different power supply also at 3.3 volt.

Conventional POR circuits such as the POR circuit 100 cannot provide power-on reset functions to this type of integrated circuits because the single power supply involved. Additionally, conventional POR circuits such as the POR circuit 100 cannot properly handle power-on resets when the power supplies are turned on in different sequences.

There is therefore a need for a power-on-reset circuit to perform proper reset functions for integrated circuits supplied by different power sources.

SUMMARY OF THE INVENTION

In a general aspect, the present invention relates to a power-on reset circuit that includes a first circuit that includes: a first NMOS transistor having a gate controlled by a low voltage supply VDD_L; a resistor connected between the source of the first NMOS transistor and a voltage supply VSS, wherein VSS is lower than VDD_L; and one or more diodes serially connected between a high voltage supply VDD_H and the drain of the first NMOS transistor, wherein VDD_H≧VDD_L; and a second circuit that includes: a first PMOS transistor having a source connected to VDD_L; a second PMOS transistor having a source connected to the drain of first PMOS transistor; a second NMOS transistor connected between the drain of the second PMOS transistor and VSS, wherein the gates of the first PMOS transistor, the second PMOS transistor, and the second NMOS transistor can be connected to the source of the first NMOS transistor; and an inverter having an input connected to the drain of the second PMOS transistor and the drain of the second NMOS transistor, wherein the inverter can output a signal RSTB in response to the power on and power off of the high voltage supply VDD_H and the low voltage supply VDD_L.

In another general aspect, the present invention relates to a power-on reset circuit that includes a first circuit that includes one or more cascode-connected NMOS transistors comprising a first NMOS transistor having a gate controlled by a low voltage supply VDD_L; a resistor connected between a voltage supply VSS and the source of the first NMOS transistor and VSS, wherein VSS is lower than VDD_L; and one or more diodes serially connected between a high voltage supply VDD_H and the drain of the first NMOS transistor, wherein VDD_H≧VDD_L; and a second circuit that includes a first PMOS transistor having a source connected to VDD_L; a second PMOS transistor having a source connected to the drain of first PMOS transistor; a second NMOS transistor connected between the drain of the second PMOS transistor and VSS, wherein the gates of the first PMOS transistor, the second PMOS transistor, and the second NMOS transistor can be connected to the source of the first NMOS transistor; and an inverter having an input connected to the drain of the second PMOS transistor and the drain of the second NMOS transistor, wherein the inverter can be powered by the low voltage supply VDD_L and the power supply VSS.

Implementations of the system may include one or more of the following. The one or more diodes in the first circuit can include a first diode connected between a high voltage supply VDD_H and the drain of the first NMOS transistor. The one or more diodes in the first circuit can include a second diode connected with the first diode and the drain of the first NMOS transistor. The second circuit can further include a third PMOS transistor having a gate connected to the input of the inverter, a source connected with the drain of first PMOS transistor, and a drain connected to VSS. The inverter can be powered by the low voltage supply VDD_L and the power supply VSS. The inverter can output a voltage substantially equal to VDD_L only when both the low voltage supply VDD_L and the high voltage supply VDD_H are at or, above their respective predetermined voltages in power on. The first diode and the second diode can be diode-connected PMOS transistors. The power-on reset circuit can further include a third NMOS transistor between the one or more diodes and the first NMOS transistor, wherein the gate of the third NMOS transistor is controlled by a mid voltage supply VDD_M, wherein VDD_H≧VDD_M≧VDD_L. The inverter can output a signal RSTB in response to the power on and power off of the high voltage supply VDD_H, the mid voltage supply VDD_M, and the low voltage supply VDD_L. The inverter can output a voltage substantially equal to VDD_L only when the low voltage supply VDD_L, the mid voltage supply VDD_M, and the high voltage supply VDD_H are all at or above their respective predetermined voltages. VDD_H can be approximately equal to 3.3 volt. VDD_L can be approximately equal to 1.8 volt.

Embodiments may include one or more of the following advantages. The disclosed power-on reset circuit can provide reliable performance in a circuit having multiple power supplies. The power-on reset performance in the disclosed circuit is independent of the power-on sequence in the different power supplies. The disclosed power-on reset circuit also reduces power leakage. Moreover, the disclosed power-on reset circuit provides a simple circuit design for monitoring power-on and power-off, and thus has small foot print compared to some conventional power-on reset circuits.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION OF THE INVENTION

Figure 1:
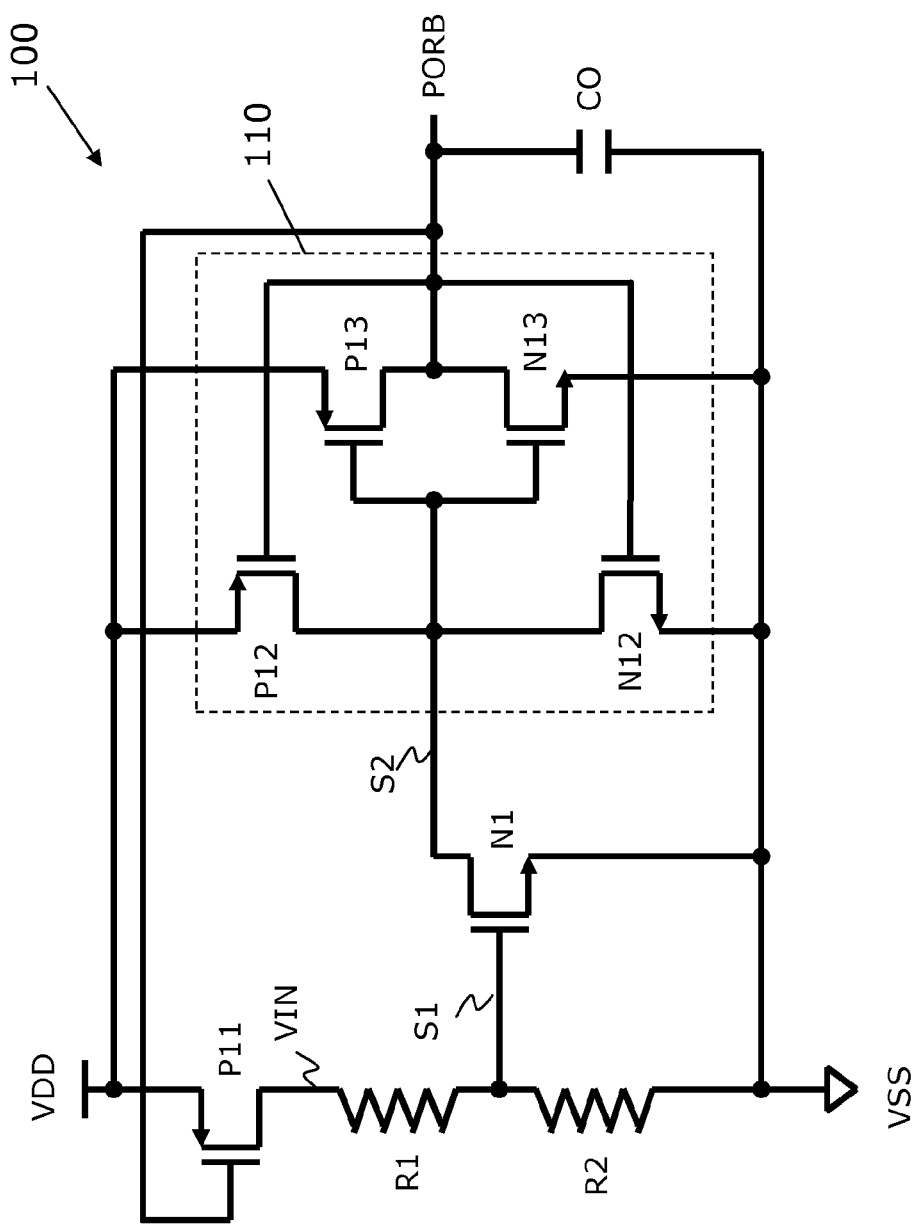
FIG. 1 is a conventional power-on reset circuit.
Figure 2:
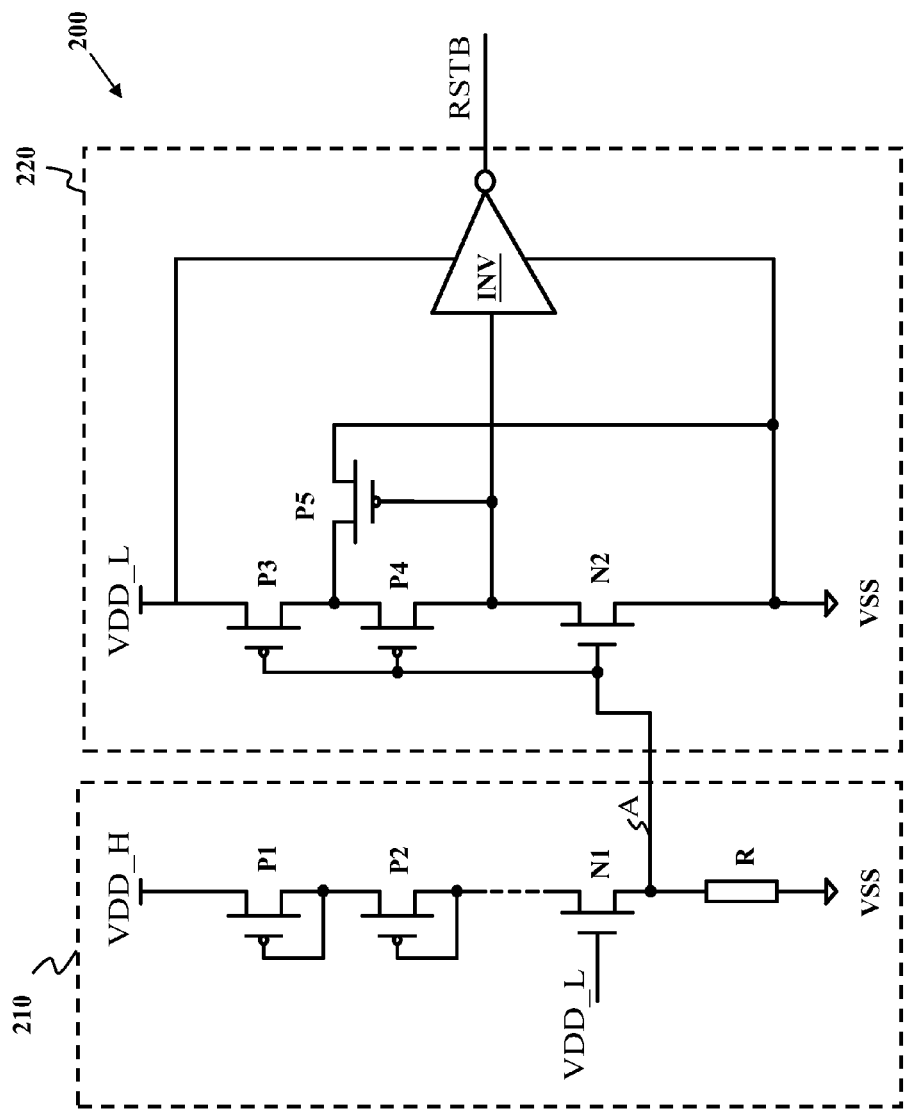
FIG. 2 is a schematic diagram of a power-on reset circuit for two power supplies in accordance with the present application.

A power-on reset circuit 200, shown in FIG. 2, includes a voltage-division circuit 210 and a voltage-monitoring circuit 220 for supplying high voltage VDD_H and a low voltage VDD_L to an integrated circuit (not shown). The voltage-division circuit 210 includes two diode-connected PMOS transistors P1 and P2, an NMOS transistor N1, and a resistor R. P1, P2, N1 are cascode connected and then in serial connection with R between the high voltage power supply VDD_H and a power supply VSS. VSS is lower than VDD_L. For instance, VSS can be connected to the ground. The source of N1 is connected with R at a node A. The gate of the NMOS transistor N1 is connected to the low voltage power supply VDD_L, which is used to monitoring the low power supply voltage VDD_L. The diode-connected transistors P1 and P2 are used to provide voltage division of VDD_H. The number of diodes (or diode-connected transistors) in the voltage-division circuit 210 can be adjusted according to VDD_H and the triggering voltage at the node A (as described below). For example, there can be one, two, three, or more diodes (or diode-connected transistors) serially connected between VDD_H and N1.

The voltage-monitoring circuit 220 monitors the voltage at the node A and in response outputs a power reset signal RSTB. The voltage-monitoring circuit 220 includes PMOS transistors P3 and P4, and an NMOS transistor N2 that are cascode connected between VDD_L and VSS. P3 has its source connected to VDD_L. P4 has its source connected to the drain of P3. The gates P3, P4, and N2 are connected with R and the source of the NMOS transistor N1 at the node A. The voltage-monitoring circuit 220 also includes an inverter INV that has its input connected to the drain of P4 and the drain of the N2. The INV is powered by the low voltage supply VDD_L and the power supply VSS. The INV is configured to output the RSTB signal for resetting internal logics of the integrated circuit in an electronic device. An additional PMOS transistor P5 has its gate connected to the input of INV, its drain connected to VSS, and its source connected with the drain of P3 and the source P4. N2, P3, P4, and P5 together form a Schmitt triggering circuit. P5 can provide hysteresis for the Schmitt trigger circuit and to set the power reset triggering voltage.

Figure 3:
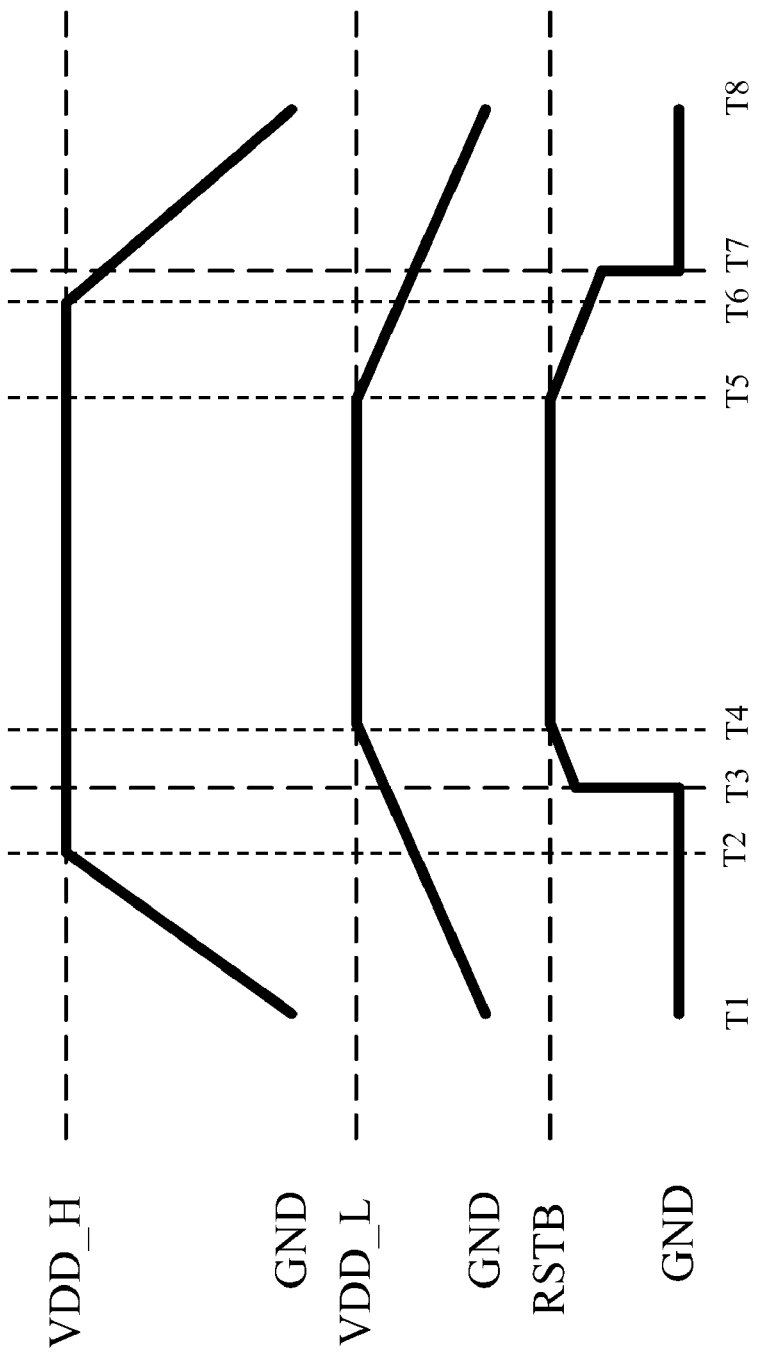
FIG. 3 illustrates voltage waveforms for an exemplified power cycling sequences in a two-power-supply power-on reset circuit in FIG. 2.

In the present specification, VDD_H, VDD_M and VDD_L refer to high, mid, and low positive power supply voltages: VDD_H≧VDD_M≧VDD_L. VDD_H, VDD_M and VDD_L are different power supplies that may have different of same power supply voltages. For example, VDD_H, VDD_M and VDD_L can respectively provide voltages respectively at 3.3 volt, 3.3 volt, and 1.8 volt. VSS can be connected to the ground. The term "power on" is used synonymous to "power up". Both "power on" and "power up" refer to the period in which power is turned on at the supply terminals. The power supply voltages VDD_H, VDD_M, VDD_L, etc. increase over time in this period. "Power off" or "brown-out" refers to the period in which power is turned off at the power supply terminals The operations of the power-on reset circuit 200 can be described using the voltage waveforms in FIGS. 3 and 4. Referring to FIGS. 2 and 3, voltage waveforms during the exemplified power-on and power-off are categorized by characteristic times T1-T8. At T1, the power supply voltages VDD_H and VDD_L start to rise, with VDD_H increasing at faster than VDD_L in this particular example. As VDD_L increases to exceed the threshold voltage for N1, N1 changes from an off state to an on state. The voltage at the node A is determined by VDD_L. VDD_H first reaches its pre-determined set voltage at time T2. But before the voltage at the node A reaches its power-operation voltage, RSTB continues to output ground voltage between T2 and T3. As VDD_L rises further to reach the power-operation voltage at time T3, RSTB rises to following the voltage waveform of VDD_L. RSTB continues to rise to the pre-set value of VDD_L at T4 at which time VDD_L reaches its pre-determined set voltage. Starting from T3, the power supply voltages reach their respective operational values for the integrated circuit. The RSTB signal notifies the integrated circuit that it is now OK to be in operation.

The power off starts when VDD_L begins to decrease at T5. VDD_H starts to decrease at T6. In the example shown in FIG. 3, VDD_L decreases at a slower rate than VDD_H. The voltage at the node A is determined by VDD_L and thus decreases following VDD_L. As the voltage at the node A drops below the power-operation voltage at the time T7, the voltage-monitoring circuit 220 is reset and RSTB drops to ground voltage. VDD_H and VDD_L reach the ground voltage at time T8.

The example illustrated in FIG. 3 and described above shows that the power-on reset circuit 200 outputs a power reset signal at RSTB only when the high and the low power supply voltages both reach predetermined voltage levels. In other words, the output RSTB is at ground voltage as long as one of the power supplies is not at a respective predetermined voltage level.

Figure 4:
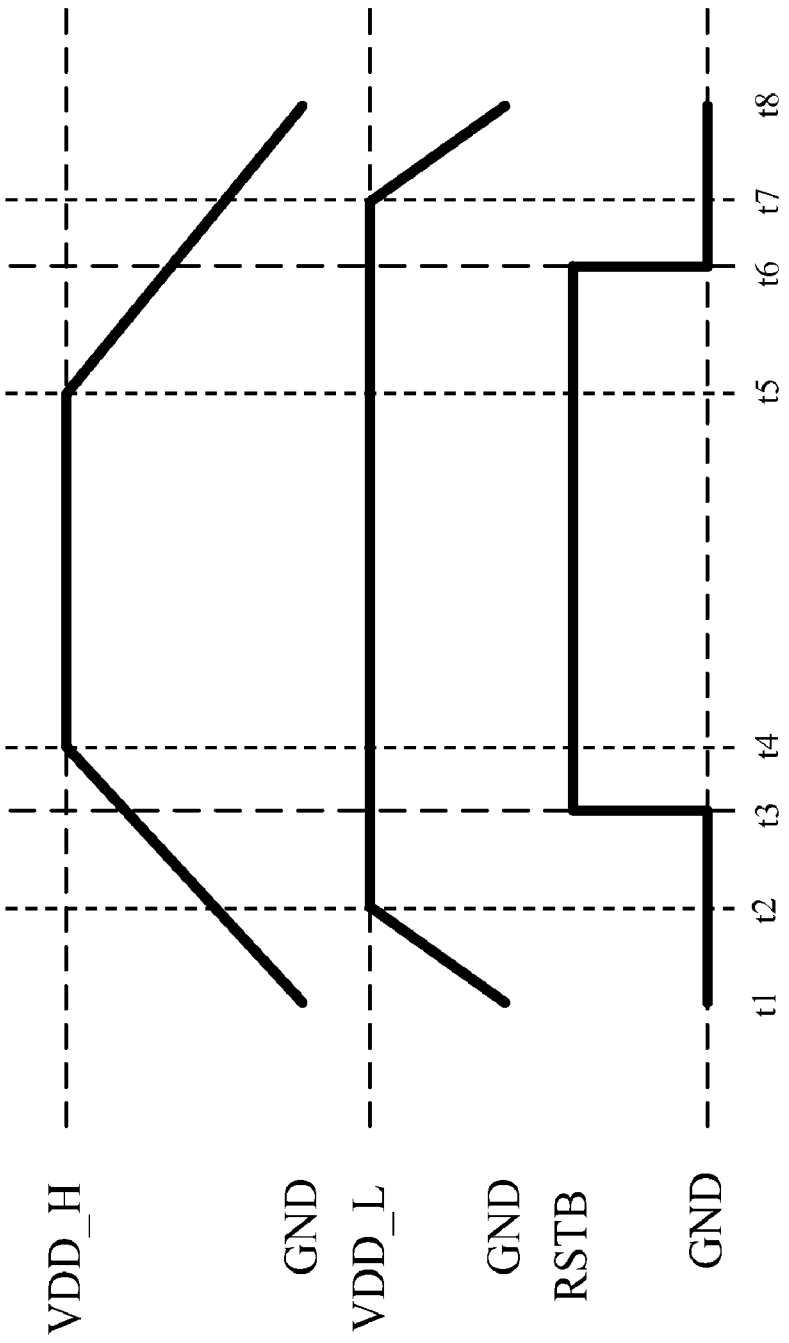
FIG. 4 illustrates voltage waveforms for an exemplified power cycling sequences in a two-power-supply power-on reset circuit in FIG. 2.

In another example, referring to FIGS. 2 and 4, the power supply voltages VDD_H and VDD_L start to rise at t1, with VDD_L increasing at faster than VDD_H in this example. VDD_L first reaches its pre-determined set voltage at time t2. However, VDD_H is still low at time t2 such that the voltage at the node A is still below the predetermined voltage power-operation voltage. The voltage at the node A is now determined by the fully set voltage at VDD_H. When VDD_H reaches it a predetermined voltage at t3, RSTB rises to its pre-determined set voltage (substantially equal to VDD_L). Starting from t3, the power supply voltages reach their respective operational values for the integrated circuit. The RSTB signal notifies the integrated circuit that it is now OK to be in operation.

In a power off, VDD_H begins to decrease at t5 while VDD_L stays constant at its set voltage. The voltage at the node A is determined by VDD_L and thus stays constant. When the voltage at the node A drops below the power-operation voltage at the time t6, the voltage-monitoring circuit 220 is reset and RSTB drops to ground voltage. VDD_L starts to decrease at t7 at a faster rate than VDD_H. VDD_H and VDD_L reach the ground voltage at time t8.

The example illustrated in FIG. 4 again shows that the power-on reset circuit 200 outputs a power reset signal (substantially equal to VDD_L) at RSTB only when the high and the low power supply voltages both reach predetermined voltage levels. The output RSTB stays at ground voltage as long as one of the power supplies is not at a respective predetermined voltage level.

Figure 5:
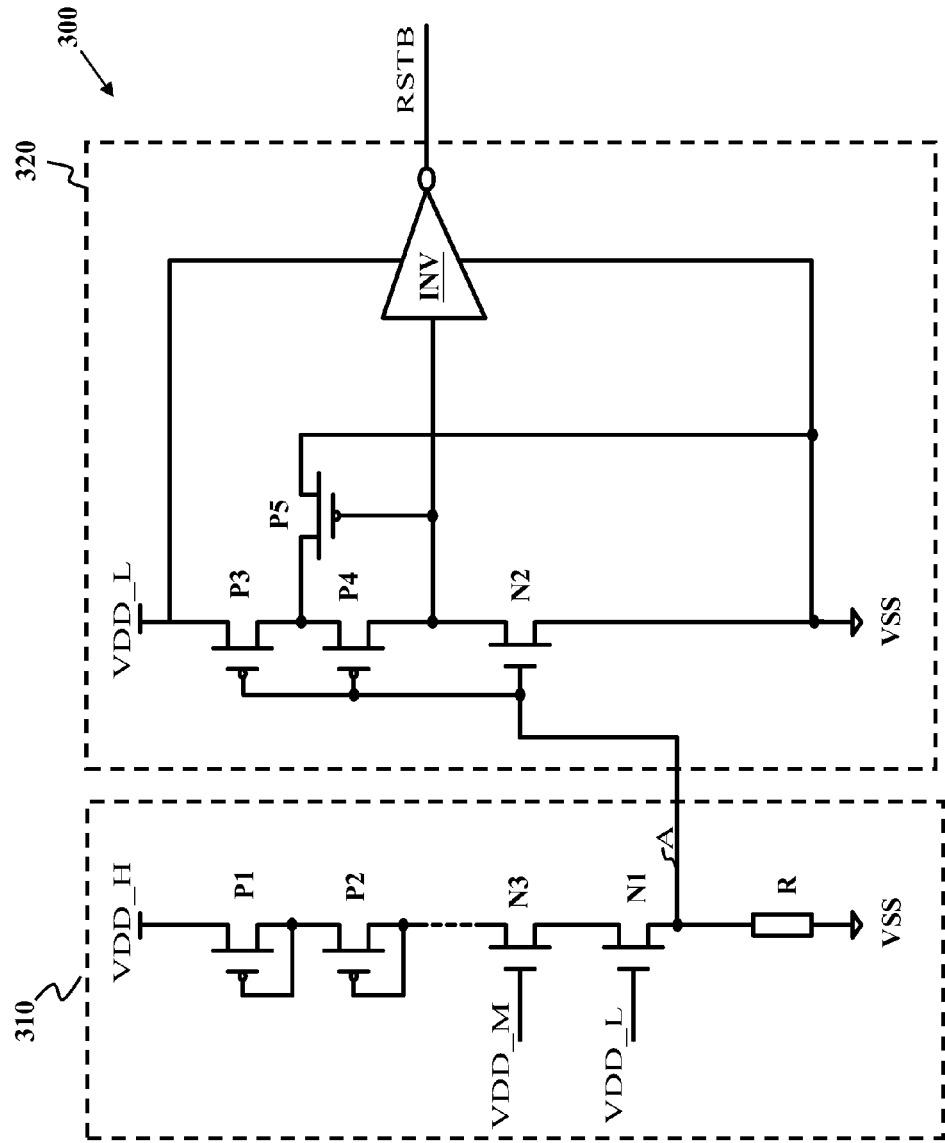
FIG. 5 is a schematic diagram of a power-on reset circuit for multiple power supplies in accordance with the present application.

The power-on reset circuit disclosed in the present invention is compatible with more than multiple voltage supplies. As shown in FIG. 5, a power-on reset circuit 300 includes a voltage-division circuit 310 and a voltage-monitoring circuit 320 for supplying high voltage VDD_H, a mid voltage VDD_M, and a low voltage VDD_L to an integrated circuit (not shown). In addition to diode-connected PMOS transistors P1 and P2, an NMOS transistor N1, and a resistor R, the voltage-division circuit 310 includes another NMOS transistor N3 cascode connected between N1 and P2. The gate of the NMOS transistor N3 is connected to the mid voltage power supply VDD_M. The voltage-monitoring circuit 320 can have a same layout as the voltage-monitoring circuit 220.

The on and off states of the NMOS transistor are determined by VDD_M and VDD_L. VDD_M, and VDD_L each has to be higher than N1's threshold voltage before N1 and N3 can be turned on. Thus the voltage at the node A is also determined by VDD_H, VDD_M, and VDD_L. The power-on reset circuit 300 outputs a power reset signal (substantially equal to VDD_L) at RSTB only when all the power supply voltages reach predetermined voltage levels. The output RSTB stays at ground voltage as long as one of the power supplies is not at a respective predetermined voltage level.

The disclosed circuits and methods may have one or more of the following advantages. The disclosed power-on reset circuit can provide reliable performance in a circuit having multiple power supplies. The power-on reset performance in the disclosed circuit is independent of the power-on sequence in the different power supplies. The disclosed power-on reset circuit provides a simple circuit design for monitoring power-on and power-off, and thus has small foot print compared to some conventional power-on reset circuits.

It is understood that the disclosed circuit and methods are compatible with other configurations of the electronic components and variations in circuit designs without deviation from the spirit of the present specification. Various forms of resistors, capacitors, transistors, and amplifiers can be used to achieve similar results as described above. The diode-connected PMOS transistors in the voltage-division circuit can be replaced by diodes. The voltage-monitoring circuit can be based on other designs that are Boolean equivalents to what is disclosed above. The presently disclosed system is compatible with power reset circuit for two, three, four or more power supplies.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. A power-on reset circuit, comprising:
    a first circuit, comprising:
        a first NMOS transistor having a gate controlled by a low voltage supply VDD_L;
        a resistor connected between the source of the first NMOS transistor and a voltage supply VSS, wherein VSS is lower than VDD_L; and
        one or more diodes serially connected between a high voltage supply VDD_H and the drain of the first NMOS transistor, wherein VDD_H≧VDD_L; and
    a second circuit, comprising:
        a first PMOS transistor having a source connected to VDD_L;
        a second PMOS transistor having a source connected to the drain of first PMOS transistor;
        a second NMOS transistor connected between the drain of the second PMOS transistor and VSS, wherein the gates of the first PMOS transistor, the second PMOS transistor, and the second NMOS transistor are connected to the source of the first NMOS transistor; and
        an inverter having an input connected to the drain of the second PMOS transistor and the drain of the second NMOS transistor, wherein the inverter is configured to output a signal RSTB in response to the power on and power off of the high voltage supply VDD_H and the low voltage supply VDD_L.

2. The power-on reset circuit of claim 1, wherein the one or more diodes in the first circuit comprise &first diode connected between a high voltage supply VDD_H and the drain of the first NMOS transistor.

3. The power-on reset circuit of claim 2, wherein the one or more diodes in the first circuit comprise a second diode connected with the first diode and the drain of the first NMOS transistor.

4. The power-on reset circuit of claim 1, wherein the second circuit further comprises a third PMOS transistor having a gate connected to the input of the inverter, a source connected with the drain of first PMOS transistor, and a drain connected to VSS.

5. The power-on reset circuit of claim 1, wherein the inverter is powered by the low voltage supply VOD_L and the power supply VSS.

6. The power-on reset circuit of claim 1, wherein the inverter is configured to output a voltage substantially equal to VDD_L only when both the low voltage supply VDD_L and the high voltage supply VDD_H are at or above their respective predetermined voltages in power on.

7. The power-on reset circuit of claim 1, wherein the first diode and the second diode are diode-connected PMOS transistors.

8. The power-on reset circuit of claim 1, further comprising a third NMOS transistor between the one or more diodes and the first NMOS transistor, wherein the gate of the third NMOS transistor is controlled by a mid voltage supply VDD_M, wherein $VDD\_H \geq VDD\_M \geq VDD\_L$.

9. The power-on reset circuit of claim 8, wherein the inverter is configured to output a signal RSTB in response to the power on and power off of the high voltage supply VDD_H, the mid voltage supply VDD_M, and the low voltage supply VDD_L.

10. The power-on reset circuit of claim 8, wherein the inverter is configured to output a voltage substantially equal to VDD_L only when the low voltage supply VDD_L, the mid voltage supply VDD_M, and the high voltage supply VDD_H are all at or above their respective predetermined voltages.

11. A power-on reset circuit, comprising:
a first circuit, comprising:
one or more cascode-connected NMOS transistors comprising a first NMOS transistor having a gate controlled by a low voltage supply VDD_L;
a resistor connected between a voltage supply VSS and the source of the first NMOS transistor and VSS, wherein VSS is lower than VDD_L; and
one or more diodes serially connected between a high voltage supply VDD_H and the drain of the first NMOS transistor, wherein $VDD\_H \geq VDD\_L$; and
a second circuit, comprising:
a first PMOS transistor having a source connected to VDD_L;
a second PMOS transistor having a source connected to the drain of first PMOS transistor;
a second NMOS transistor connected between the drain of the second PMOS transistor and VSS, wherein the gates of the first PMOS transistor, the second PMOS transistor, and the second NMOS transistor are connected to the source of the first NMOS transistor; and
an inverter having an input connected to the drain of the second PMOS transistor and the drain of the second NMOS transistor, wherein the inverter is powered by the low voltage supply VDD_L and the power supply VSS.

12. The power-on reset circuit of claim 11, wherein the one or more diodes in the first circuit comprise a first diode connected between a high voltage supply VDD_H and the drain of the first NMOS transistor.

13. The power-on reset circuit of claim 12, wherein the one or more diodes in the first circuit comprise a second diode connected with the first diode and the drain of the first NMOS transistor.

14. The power-on reset circuit of claim 11, wherein the first diode and the second diode are diode-connected PMOS transistors.

15. The power-on reset circuit of claim 11, wherein the one or more cascode-connected NMOS transistors in the first circuit comprises a third NMOS transistor between the first diode and the first NMOS transistor, wherein the gate of the third NMOS transistor is controlled by a mid voltage supply VDD_M, wherein $VDD\_H \geq VDD\_M \geq VDD\_L$.

16. The power-on reset circuit of claim 15, wherein the inverter is configured to output a signal RSTB in response to the power on and power off of the high voltage supply VDD_H, the mid voltage supply VDD_M, and the low voltage supply VDD_L.

17. The power-on reset circuit of claim 15, wherein the inverter is configured to output a voltage substantially equal to VDD_L only when the low voltage supply VDD_L, the mid voltage supply VDD_M, and the high voltage supply VDD_H are all at or above their respective predetermined voltages.

18. The power-on reset circuit of claim 11, wherein the inverter is configured to output a voltage substantially equal to VDD_L only when both the low voltage supply VDD_L and the high voltage supply VDD_H are at or above their respective predetermined voltages in power on.

19. The power-on reset circuit of claim 11, wherein the second circuit further comprises a third PMOS transistor having a gate connected to the input of the inverter, a source connected with the drain of first PMOS transistor, and a drain connected to VSS.

20. The power-on reset circuit of claim 11, wherein VDD_H is approximately equal to 3.3 volt, wherein VDD_L is approximately equal to 1.8 volt.

* * * * *